United States Patent
Ha

(10) Patent No.: US 7,639,550 B2
(45) Date of Patent: Dec. 29, 2009

(54) SEMICONDUCTOR MEMORY DEVICE WITH BI-DIRECTIONAL READ AND WRITE DATA TRANSPORT

(75) Inventor: Sung-Joo Ha, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 114 days.

(21) Appl. No.: 11/819,821

(22) Filed: Jun. 29, 2007

(65) Prior Publication Data

US 2008/0062794 A1    Mar. 13, 2008

(30) Foreign Application Priority Data

Sep. 1, 2006    (KR) .................. 10-2006-0084104

(51) Int. Cl.
*G11C 7/00*    (2006.01)

(52) U.S. Cl. ............. 365/189.11; 365/203; 365/230.06; 365/206; 365/63

(58) Field of Classification Search ............ 365/189.11, 365/63, 203, 230.06, 206, 207, 230.04
See application file for complete search history.

(56) References Cited

U.S. PATENT DOCUMENTS

| | | | | |
|---|---|---|---|---|
| 5,936,897 A | * | 8/1999 | Koga | ......................... 365/190 |
| 6,081,477 A | | 6/2000 | Li | |
| 6,363,023 B2 | * | 3/2002 | Andersen et al. | ............ 365/207 |
| 6,813,204 B2 | | 11/2004 | Kim et al. | |
| 2004/0032776 A1 | | 2/2004 | Kim et al. | |
| 2006/0018168 A1 | | 1/2006 | Kim | |
| 2007/0002644 A1 | | 1/2007 | Kang | |

FOREIGN PATENT DOCUMENTS

| | | |
|---|---|---|
| JP | 2003-143240 | 5/2003 |
| JP | 2005-317124 | 11/2005 |
| KR | 1997-0071795 | 11/1997 |
| KR | 10-2000-0019463 | 4/2000 |
| KR | 10-2002-0084531 | 11/2002 |

OTHER PUBLICATIONS

Kushiyama, N. et al., "An Experimental 295 MHz CMOS 4K × 256 SRAM Using Bidirectional Read/Write Shared Sense Amps and Self-Timed Pulsed Word-Line Drivers," Nov. 1995, IEEE Journal of Solid-State Circuits, vol. 30, No. 11, pp. 1286-1290.*

* cited by examiner

*Primary Examiner*—Van Thu Nguyen
*Assistant Examiner*—R Lance Reidlinger
(74) *Attorney, Agent, or Firm*—IP & T Law Firm PLC

(57) ABSTRACT

A semiconductor memory device includes a pair of local input/output (IO) lines, a global IO line, a local driver configured to pull up/down voltage levels of the first and second local IO lines in response to input data, a global driver configured to pull up/down a voltage level of the global IO line in response to input data, and a data IO control block configured to transport output data from the local IO lines to the global driver and input data from the global IO line to the local driver.

4 Claims, 5 Drawing Sheets

SEMICONDUCTOR MEMORY DEVICE WITH BI-DIRECTIONAL READ AND WRITE DATA TRANSPORT

CROSS-REFERENCES TO RELATED APPLICATIONS

The present invention claims priority of Korean patent application number 10-2006-0084104 filed on Sep. 1, 2006, which is incorporated by reference in its entirety.

BACKGROUND OF THE INVENTION

The present invention relates to a semiconductor memory device, more particularly, to a circuit configured to transport data during read and write operations in a semiconductor memory device.

A semiconductor memory device is used to store data and provide desired data. A write operation for storing data and a read operation for outputting a selected data among the stored data are main operations of the semiconductor memory device. A precharge operation for preparing the read and write operations is also provided in the case where the read and write operations are not performed. In a semiconductor memory device in which a capacitor is used as a data storage unit (e.g., dynamic random access memory (DRAM) device), a refresh operation is also performed to compensate for naturally occurring leakage of charges stored in the capacitor.

A semiconductor memory device includes unit cells, which are basic elements for data storage and are arranged in a matrix form to effectively input/output a large amount of data. The unit cells arranged in the matrix form are allocated individually at points where a plurality of word lines crossing horizontally intersect with a plurality of bit lines crossing vertically. Row addresses allocate the word lines, while column addresses allocate the bit lines. In general, when a read or write operation is performed, a row address is first input to select one of the word lines, and then a column address to select one of the bit lines. One unit cell corresponding to the selected word line and bit line is to be accessed to perform a read or write operation.

For effective configuration, a semiconductor memory device receives row addresses and column addresses through an address input pad, and uses input/output (IO) pads for data input and output. Data are output through the data IO pads during a read operation, and input through the data IO pads during a write operation. Because one data transport line exists between the unit cell and the data IO pads, a transport circuit for a write operation and another transport circuit for a read operation are arranged to transport data in a given direction during the read and write operations, respectively.

FIG. 1 is a block diagram illustrating data input and output of a conventional semiconductor memory device. The semiconductor memory device includes an output data transport block 10 and an input data transport block 20.

The output data transport block 10 includes an IO sense amplifier 11 and a global driver 12. The IO sense amplifier 11 is configured to sense signal levels of output data transported through local IO lines LIO and LIOb and amplify the sensed signal levels. The global driver 12 drives a global IO line GIO according to the data transported from the IO sense amplifier 11.

The input data transport block 20 includes a data transport unit 21, first and second local driver units 22 and 23, and a local IO line control unit 24. The data transport unit 21 is configured to receive the data transported through the global IO line GIO in response to a write control signal WTDDRV-CON. The first and second local driver units 22 and 23 are configured to transport the data from the data transport unit 21 to the respective local IO lines LIO and LIOb. The local IO line control unit 24 is configured to control a precharge level of the local IO lines LIO and LIOb.

During a read operation, the IO sense amplifier 11 senses data transported through the local IO lines LIO and LIOb and amplifies the sensed data. The global driver 12 drives the amplified data to the global IO line GIO. The data transported through the global IO line GIO pass through a data output buffer and are output outside through an IO pad.

During a write operation, data transported through the IO pad, a data input buffer, and the global IO line GIO in sequence is input to the data transport unit 21. The data transport unit 21 senses a level of the data transported through the global IO line GIO and transports a first signal of a first level and a second signal of a second level corresponding to the sensed level of the data to the respective first and second local driver units 22 and 23. The local IO line control unit 24 controls the local lines LIO and LIOb to be precharged when the data are not provided to the local IO lines LIO and LIOb.

FIG. 2 illustrates a schematic circuit diagram of the output data transport block 10 illustrated in FIG. 1. The IO sense amplifier 11 senses voltage levels of signals provided to the local IO lines LIO and LIOb in response to a read control signal IOSACON, and amplifies voltage levels of two nodes A and B corresponding to the sensed signal voltage levels. According to the voltage levels at the nodes A and B, the IO sense amplifier 11 outputs signals D0 and D1b to the global driver 12. The global driver 12 drives the global IO line GIO in a pull-up or pull-down mode in response to the signals D0 and D1b.

FIG. 3 illustrates a schematic circuit diagram of the input data transport block 20 illustrated in FIG. 1. The data transport unit 21 stores data transported through the global IO line GIO into first and second latches L1 and L2 when the write control signal WTDRVCON is input in a logically low level. The data stored into the first and second latches L1 and L2 are transported to third and fourth latches L3 and L4 when the write control signal WTDRVCON becomes a logically high level. The transported data at the third and fourth latches L3 and L4 are transported to the first and second local driver units 22 and 23. The first and second local driver units 22 and 23 transport the data transported by the third and fourth latches L3 and L4 to the respective local IO lines LIO and LIOb. When the data are not provided to the local IO lines LIO and LIOb, the local IO line control unit 24 controls voltage levels of the local IO lines LIO and LIOb to be precharged to a logically high level.

As described above, the conventional semiconductor memory device needs to be configured with the output data transport block 10 and the input data transport block 20 that receive data and transport the received data during the individual read and write operations in order to smoothly execute the read and write operations through one of the data transport lines, herein the global IO line GIO and the local IO lines LIO and LIOb.

During the execution of the read and write operations, the semiconductor memory device inputs multiple pieces of data in parallel and outputs the data, instead of inputting and outputting one piece of data at each time. For instance, assuming that 4 banks are provided in the case of ×16 DRAM, 16×4 numbers of global lines, 32×4 numbers of local IO lines, and 16×4 numbers of output data transport blocks IO and input data transport blocks 20 need to be arranged in the semiconductor memory device.

Another conventional semiconductor memory device is implemented with a pre-fetch operation in which 2-bit data or 4-bit data are fetched prior to inputting or outputting data. For this pre-fetch operation, this type of semiconductor memory device generally requires more data transport lines than the first mentioned conventional semiconductor memory device. However, those lines and transport units arranged to input and output data often occupy a large area. Also, the data transport lines need to be arranged close to the individual banks so as to reduce the load on the data transport lines. Because many data transport lines and data transport circuits are generally necessary, it may be difficult to effectively arrange the data transport lines and the data transport circuits.

SUMMARY OF THE INVENTION

Specific embodiments of the present invention are directed toward providing a semiconductor memory device capable of processing data input or output in parallel using a reduced number of data transport lines.

In accordance with one aspect of the present invention, there is provided a semiconductor memory device includes a pair of local input/output (IO) lines, a global IO line, a local driver configured to pull up/down voltage levels of the first and second local IO lines in response to input data, a global driver configured to pull up/down a voltage level of the global IO line in response to input data, and a data IO control block configured to transport output data from the local IO lines to the global driver and input data from the global IO line to the local driver.

DESCRIPTION OF SPECIFIC EMBODIMENTS

Figure 1:
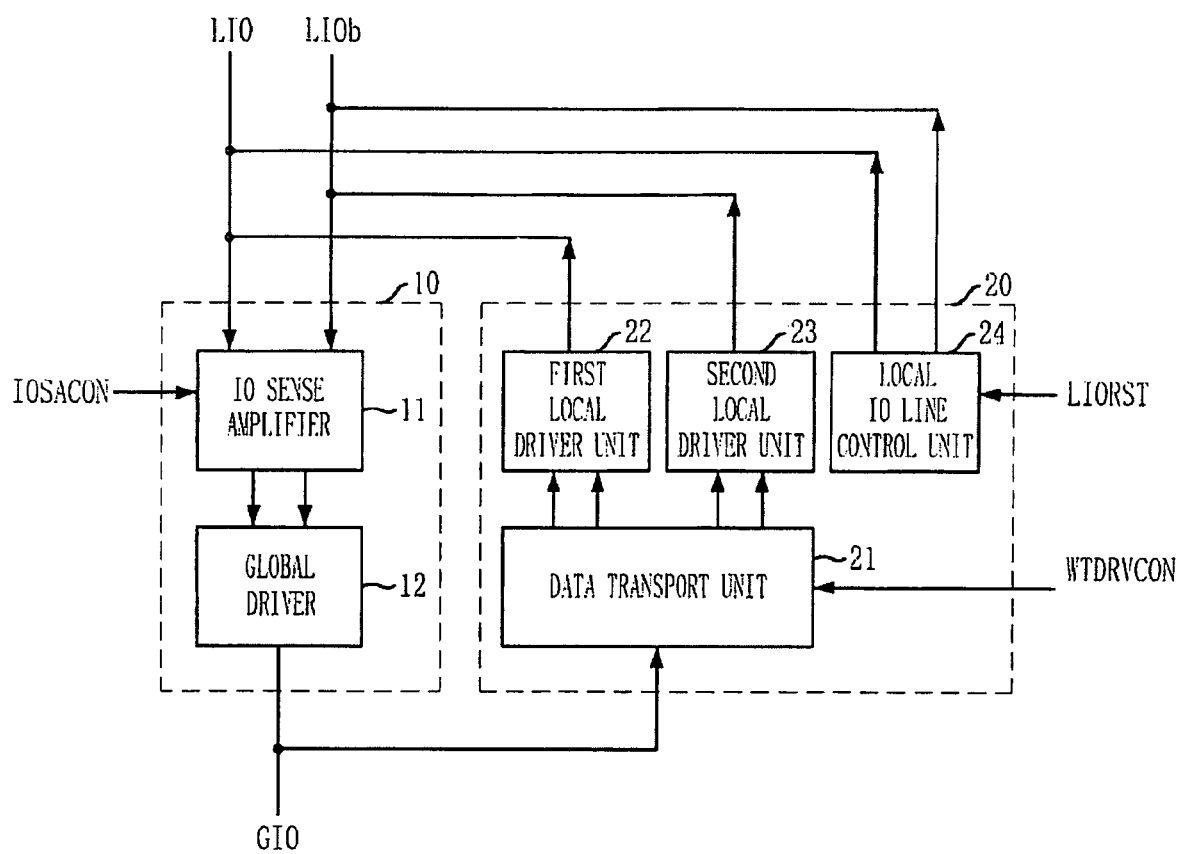
FIG. 1 is a block diagram illustrating data input and output of a conventional semiconductor memory device.
Figure 2:
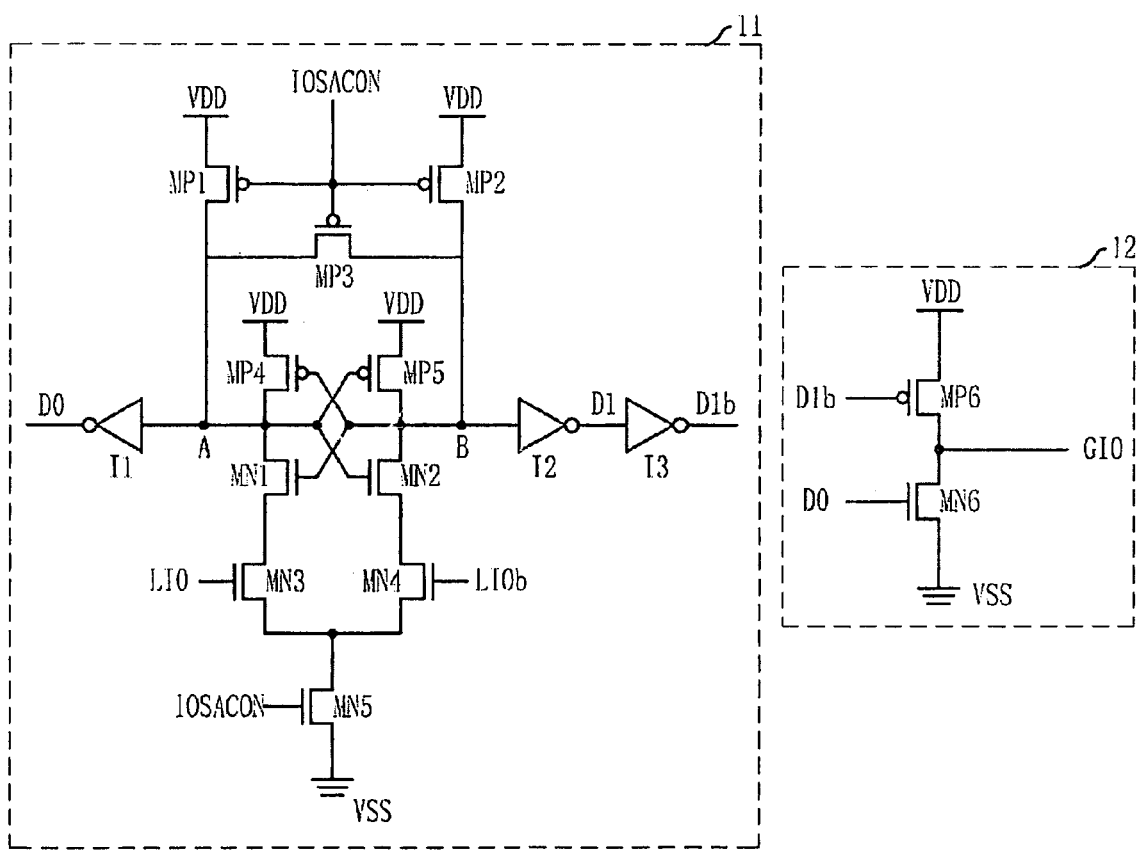
FIG. 2 illustrates a schematic circuit diagram of the output data transport block 10 illustrated in FIG. 1.
Figure 3:
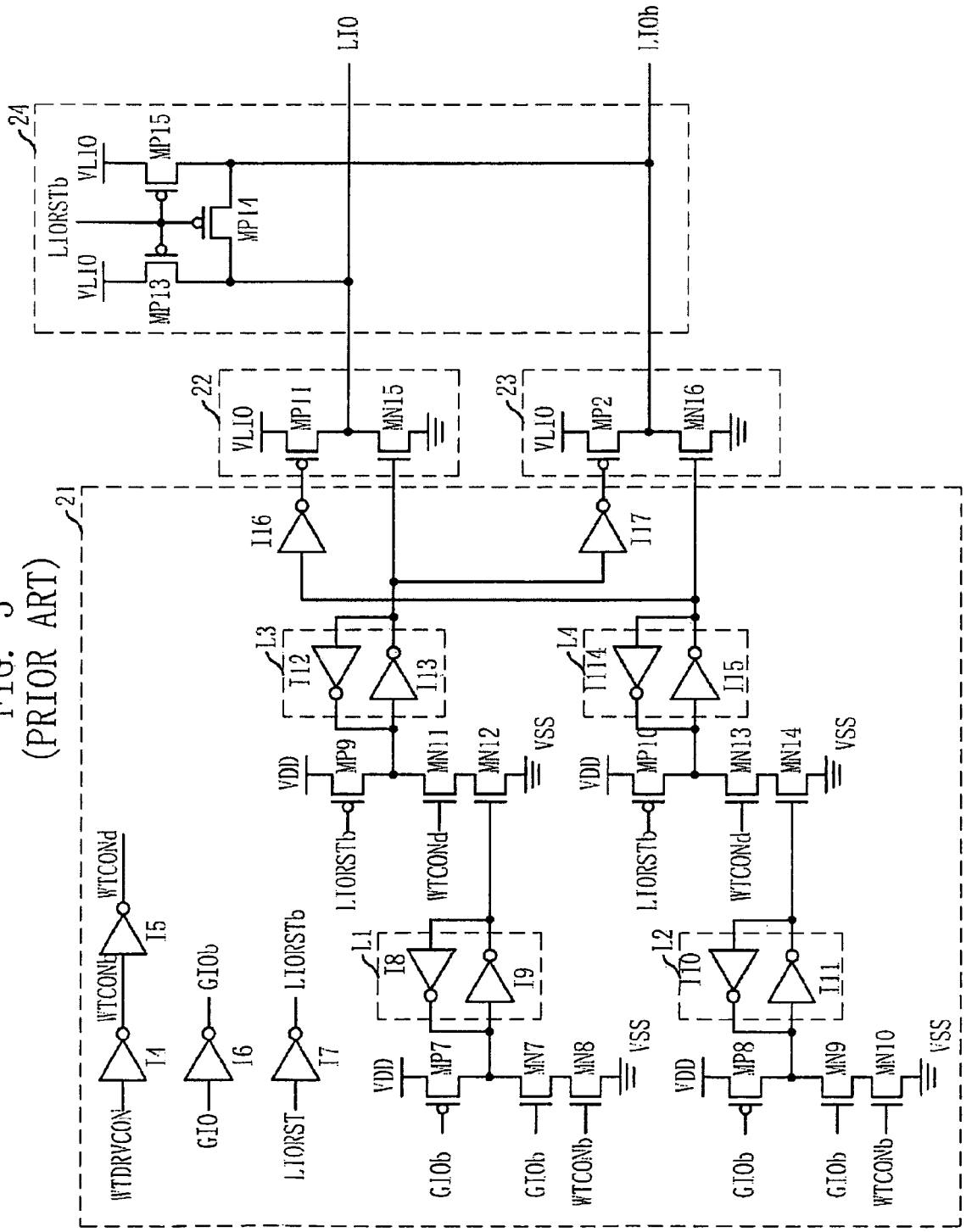
FIG. 3 illustrates a schematic circuit diagram of the input data transport block 20 illustrated in FIG. 1.
Figure 4:
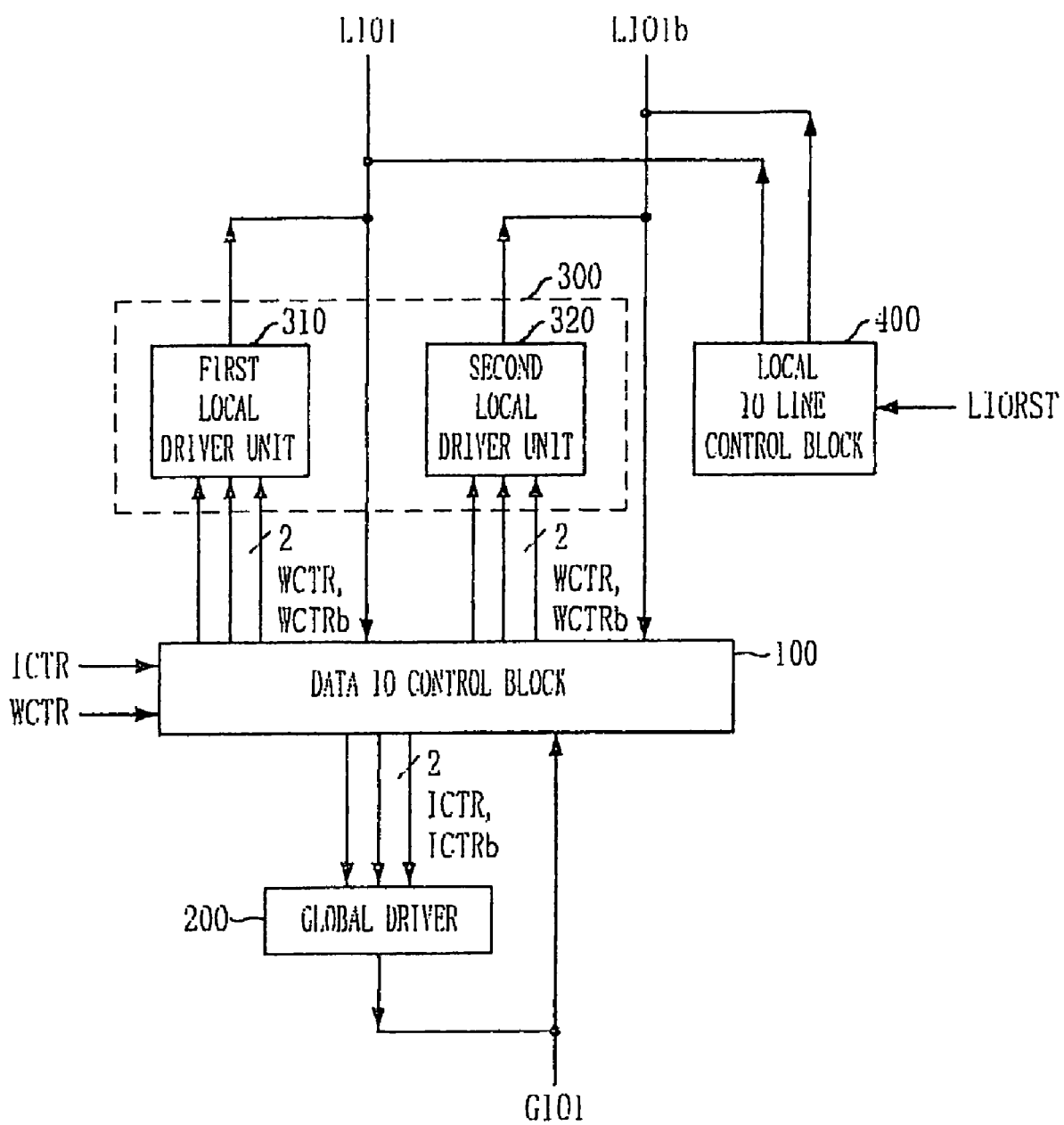
FIG. 4 illustrates a simplified block diagram of a semiconductor memory device in accordance with an embodiment of the present invention.

FIG. 4 illustrates a simplified block diagram of a semiconductor memory device in accordance with an embodiment of the present invention. The semiconductor memory device includes a data input/output (IO) control block 100, a global driver 200, a local driver 300, first and second local IO lines LIO1 and LIO1b, and a global IO line GIO1. The local driver 300 is configured to drive the first and second local IO lines LIO1 and LIO1b corresponding to an input data. The global driver 200 is configured to drive the global IO line GIO1 corresponding to an output data. The data IO control block 100 transports the output data transported through the first and second local IO lines LIO1 and LIO1b to the global driver 200, and the input data transported through the global IO line GIO1 to the local driver 300. The semiconductor memory device may further include a local IO line control block 400 used to control a precharge level of the first and second local IO lines LIO1 and LIO1b.

The local driver 300 includes a first local driver unit 310 and a second local driver unit 320. In response to a write operation signal WCTR, the first local driver unit 310 drives the first local line LIO1 according to input data provided from the data IO control block 100. In response to the write operation signal WCTR, the second local driver unit 320 drives the second local IO line LIO1b according to the input data provided from the data IO control block 100. In response to a read operation signal ICTR, the global driver 200 drives the global IO line GIO1 according to output data provided from the data IO control block 100.

Figure 5:
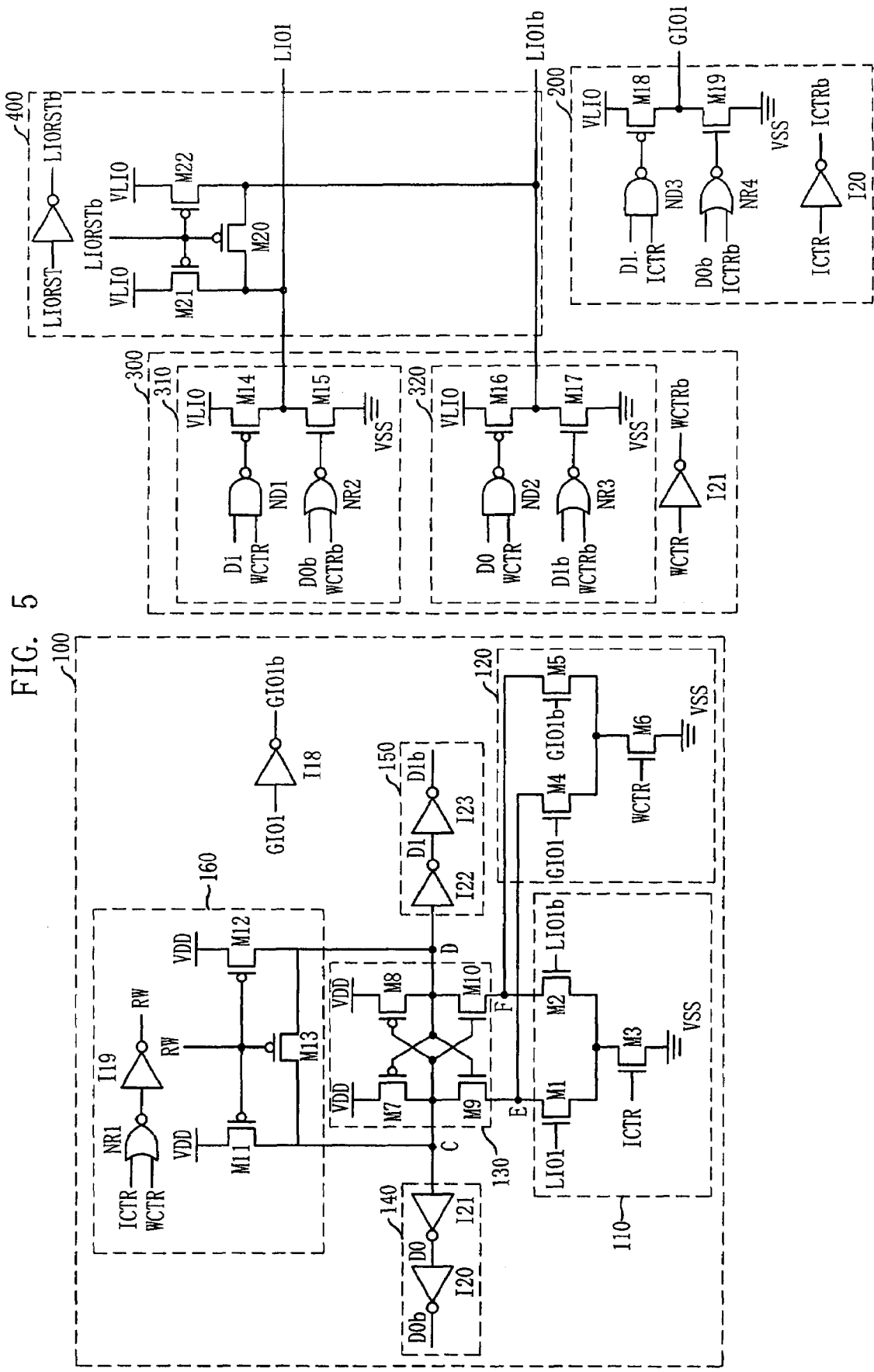
FIG. 5 illustrates a schematic circuit diagram of the semiconductor memory device illustrated in FIG. 4.

FIG. 5 illustrates a schematic circuit diagram of the semiconductor memory device illustrated in FIG. 4. The data IO control block 100 includes a first input unit 110, a second input unit 120, a sense amplifier 130, and first and second data output units 140 and 150. The first input unit 110 is used to receive output data in response to the read operation signal ICTR, and the second input unit 120 is used to receive input data in response to the write operation signal WCTR. The sense amplifier 130 senses and amplifies the output data provided by the first input unit 110 or the input data provided by the second unit 120. The first and second data output units 140 and 150 are used to output the input data or the output data amplified at the sense amplifier 130. The data IO control block 100 may further include a precharge unit 160 used to precharge the sense nodes C and D in response to the read operation signal ICTR and the write operation signal WCTR.

The first input unit 110 includes first, second and third metal oxide semiconductor (MOS) transistors M1, M2 and M3. The third MOS transistor M3 receives the read operation signal ICTR through a gate of the third MOS transistor M3, and one terminal thereof is connected to a terminal of a ground voltage VSS. The first MOS transistor M1 receives the signal from the first local IO line LIO1 through a gate of the first MOS transistor M1, and is connected between an input node E and the third MOS transistor M3. The second MOS transistor M2 receives the signal from the second local IO line LIO1b through a gate of the second MOS transistor M2, and is connected between another input node F and the third MOS transistor M3.

The second input unit 120 includes fourth, fifth and sixth MOS transistors M4, M5 and M6. The sixth MOS transistor M6 receives the write operation signal through a gate of the sixth MOS transistor M6, and one terminal thereof is connected to the terminal of the ground voltage VSS. The fourth MOS transistor M4 receives the signal from the global IO line GIO1, and is connected between the input node E and the sixth MOS transistor M6. The fifth MOS transistor M5 receives an inverted signal of the signal from the global IO line GIO1, and is connected between the other input node F and the sixth MOS transistor M6.

The sense amplifier 130 includes seventh to tenth MOS transistors M7, M8, M9, and M10. The ninth MOS transistor M9 is connected between the input node E and the sense node C, and includes a gate connected to the other sense node D. The tenth MOS transistor M10 is connected between the other input node F and the other sense node D, and includes a gate connected to the sense node C. The seventh MOS transistor M7 is connected between a terminal of a power supply voltage VDD and the sense node C, and includes a gate connected to the other sense node D. The eighth MOS transistor M8 is connected between the terminal of the power supply voltage VDD and the other sense node D, and includes a gate connected to the sense node C.

The local IO line control block 400 includes first, second and third MOS transistors M20, M21 and M22. The second MOS transistor M21 is configured to provide a precharge voltage VLIO to the first local IO line LIO1 in response to a control signal LIORSTb input through a gate of the second MOS transistor M21. The third MOS transistor M22 is configured to provide the precharge voltage VLIO to the second local IO line LIO1b in response to the control signal LIORSTb through a gate of the MOS transistor M22. The first MOS transistor M20 is configured to sustain the voltage level of the terminal of the MOS transistor M21 substantially the same as that of the terminal of the MOS transistor M22 upon receipt of the control signal LIORSTb through a gate of the MOS transistor M20.

With reference to FIGS. 4 and 5, operations of the semiconductor memory device will be described in detail. During a read operation, data provided from a memory core region are supplied to the first and second local IO lines LIO1 and LIO1b. Under this state, the write operation signal WCTR and another control signal LIORST are input in a logically low level, so that the first and second local driver units 310 and 320, and the local IO line control block 400 maintain a deactivated state. The read operation signal ICTR is input in a logically high level, so that the first input unit 110 is activated. The sense amplifier 130 included in the data IO control block 100 senses the data input to the first input unit 110 and amplifies the sensed data. The data sensed and amplified by the sense amplifier 130 are transported to the global driver 200 through the first and second data output units 140 and 150. According to the transported data, the global driver 200 pull up or pull down a voltage level of the global IO line GIO1 to a logic high or logic low level.

During a write operation, externally input data are supplied to the global IO line GIO1. Under this state, the other control signal LIORST and the read operation signal ICTR are input in a logically low level, the global driver 200, and the local IO line control block 400 are inactivated. The write operation signal WCTR is input in a logically high level, so that the second input unit 120 is activated. The sense amplifier 130 senses the data input from the second input unit 120 and amplifies the sensed data. The amplified data are transported to the first and second local driver units 310 and 320 through the first and second data signal output units 140 and 150. The local driver 300 pulls up or pulls down a voltage level of each of the first and second local IO lines LIO1 and LIO1b to a logic high or logic low level according to the transported data. An output terminal of the global driver 200 is being floated. Even if the voltage level of the global IO line GIO1 changes in an interval in which the write operation signal WCTR has a logic high, the amplified data of the sense nodes C and D have the unchanged levels after the data amplified by the sense amplifier 130 are latched on the sense nodes C and D.

When the read and write operations are not executed, the write operation signal WCTR and the read operation signal ICTR are maintained in a logically low state, the other control signal LIORST maintains a logically high state. Under this state, the output terminals of the first and second local driver units 310 and 320 and the global driver 200 are in a floating state, and the local IO line control block 400 is activated so as to precharge voltage levels of the first and second local IO lines LIO1 and LOIb to a precharge voltage level.

In the semiconductor memory device according to various embodiments of the present invention, input data are transported from the global IO line to local IO lines, and output data signals are transported from the local IO lines to the global IO line using the data IO control block, which is a data transport circuit. Thus, the semiconductor memory device according to the embodiments of the present invention can have the data transport circuits that can be prepared in about ½ reduced numbers as compared with the data transport circuits of the conventional semiconductor memory device. In particular, in the case of a memory device including a plurality of banks, using a pre-fetch operation, and inputting/ outputting a plurality of data in parallel, the area of the data transport circuit for the read and write operations can be reduced. This size reduction can allow the fabrication of semiconductor memory devices at low cost.

While the present invention has been described with respect to specific embodiments, it will be apparent to those skilled in the art that various changes and modifications may be made without departing from the spirit and scope of the invention as defined in the following claims.

What is claimed is:

1. A semiconductor memory device comprising:
a pair of local input/output (IO) lines;
a global IO line;
a local driver configured to pull up/down voltage levels of the local IO lines in response to input data;
a global driver configured to pull up/down a voltage level of the global IO line according to input data; and
a data IO control block configured to transport output data from the local IO lines to the global driver and input data from the global IO line to the local driver,
wherein the data IO control block includes an amplification unit configured to amplify the input data selectively provided through first and second sense nodes and the output data selectively provided through the first and second sense nodes in response to read and write operation signals,
wherein the data IO control block further includes:
a first input unit used to receive the output data in response to the read operation signal;
a second input unit used to receive the input data in response to the write operation signal;
the amplification unit used to amplify the output data provided by the first input unit through the first and second sense nodes and the input data provided by the second input unit through the first and second sense nodes; and
data output units used to output the output data and the input data amplified at the amplification unit,
wherein the local driver pulls up/down the voltage levels of the local IO lines according to the input data provided by the data output units in response to the write operation signal,
wherein the global driver pulls up/down the voltage level of the global IO line according to the output data provided by the data output units in response to the read operation signal,
wherein the data IO control block further includes a precharge unit used to precharge the first and second sense nodes in response to the read operation signal and the write operation signal,
wherein the first input unit includes:
a first metal oxide semiconductor (MOS) transistor receiving the read operation signal through a gate of the first MOS transistor and including one terminal coupled to a terminal of a ground voltage;
a second MOS transistor receiving a signal from a first local IO line through a gate of the second MOS transistor and coupled between a first input node and the first MOS transistor; and
a third MOS transistor receiving a signal from a second local IO line through a gate of the third MOS transistor and coupled between a second input node and the first MOS transistor.

2. The semiconductor memory device of claim 1, wherein the second input unit comprises:

a fourth MOS transistor receiving the write operation signal through a gate of the fourth MOS transistor and including one terminal coupled to the terminal of the ground voltage;

a fifth MOS transistor receiving a signal from the global IO line through a gate of the fifth MOS transistor and coupled between the first input node and the fourth MOS transistor; and a sixth MOS transistor receiving an inverted signal of the signal from the global IO line through a gate of the sixth MOS transistor and coupled between the second input node and the fourth MOS transistor.

3. The semiconductor memory device of claim 2, wherein the amplification unit comprises:

a seventh MOS transistor coupled between the first input node and the first sense node and including a gate coupled to the second sense node;

an eighth MOS transistor coupled between the second input node and the second sense node and including a gate coupled to the first sense node;

a ninth MOS transistor coupled between a terminal of a power supply voltage and the first sense node and including a gate coupled to the second sense node; and a tenth MOS transistor coupled between the terminal of the power supply voltage and the second sense node and including a gate coupled to the first sense node.

4. The semiconductor memory device of claim 1, wherein the data IO control block comprises:

an eleventh MOS transistor used to provide a precharge voltage to the first local IO line in response to a control signal through a gate of the eleventh MOS transistor;

a twelfth MOS transistor used to provide the precharge voltage to the second local IO line in response to the control signal through a gate of the twelfth MOS transistor; and a thirteenth MOS transistor used to sustain a voltage level of the terminal of the eleventh MOS transistor substantially the same as that of the terminal of the twelfth MOS transistor upon receipt of the control signal through a gate of the thirteenth MOS transistor.

* * * * *